United States Patent
Komori (10) Patent No.: US 7,472,786 B2
(45) Date of Patent: Jan. 6, 2009

(54) NON-CONTACT CONVEYING DEVICE USING SUPERCONDUCTING MAGNETIC LEVITATION

(75) Inventor: Mochimitsu Komori, Kitakyushu (JP)

(73) Assignee: Kyushu Institute of Technology, Fukuoka (JP)

( * ) Notice: Subject to any disclaimer, the term of this patent is extended or adjusted under 35 U.S.C. 154(b) by 21 days.

(21) Appl. No.: 11/793,202

(22) PCT Filed: Dec. 8, 2005

(86) PCT No.: PCT/JP2005/022577

§ 371 (c)(1), (2), (4) Date: Jun. 18, 2007

(87) PCT Pub. No.: WO2006/067974

PCT Pub. Date: Jun. 29, 2006

(65) Prior Publication Data

US 2008/0029368 A1   Feb. 7, 2008

(30) Foreign Application Priority Data

Dec. 20, 2004   (JP) .............................. 2004-368136

(51) Int. Cl.
*H02N 15/04*   (2006.01)
(52) U.S. Cl. ..................... 198/619; 414/749.3; 104/284
(58) Field of Classification Search ................ 198/619; 414/749.2, 749.3; 104/281, 283, 284
See application file for complete search history.

(56) References Cited

U.S. PATENT DOCUMENTS 5,360,470 A * 11/1994 Ono et al. .................... 104/284
5,641,054 A * 6/1997 Mori et al. ................... 198/619
5,647,477 A * 7/1997 Morishita .................... 198/619
6,160,338 A * 12/2000 Ono ............................ 310/309

(Continued)

FOREIGN PATENT DOCUMENTS

JP    63-310304 A    12/1988

(Continued)

OTHER PUBLICATIONS

International Search Report of PCT/JP2005/022577, date of mailing Mar. 14, 2006.

*Primary Examiner*—Douglas A Hess
(74) *Attorney, Agent, or Firm*—Westerman, Hattori, Daniels & Adrian, LLP.

(57) ABSTRACT

A non-contact conveying device (10) using superconducting magnetic levitation capable of stably conveying an object (11), including: a conveying table (12) having a bottom with permanent magnets (16-19) to convey the object (11); a conveying guide unit (13) having superconductors (20) immediately below the respective magnets (16-19); distance sensors (21) on the conveying guide unit (13) for detecting a distance between the conveying table (12) and the conveying guide unit (13); damping coils (25) in the conveying guide unit (13) for generating a magnetic field upon energization thereof to damp vibration of the conveying table (12); and a control device (27) for detecting vibration of the conveying table (12) by signals from the distance sensors (21) and for controlling current applied to the damping coils (25). If disturbance occurs on the object (11) conveyed contactlessly by the superconducting magnetic levitation, the vibration is stopped within a short period of time.

10 Claims, 9 Drawing Sheets

U.S. PATENT DOCUMENTS

| | | | | |
|---|---|---|---|---|
| 6,271,606 B1 * | 8/2001 | Hazelton | ...................... | 310/12 |
| 6,279,728 B1 * | 8/2001 | Jung et al. | ................... | 198/619 |
| 6,333,572 B1 * | 12/2001 | Ono | ........................... | 310/12 |
| 6,361,268 B1 * | 3/2002 | Pelrine et al. | ............ | 414/749.2 |
| 6,418,857 B1 * | 7/2002 | Okano et al. | ................ | 104/281 |
| 6,575,669 B2 * | 6/2003 | Takasan | ...................... | 406/197 |
| 7,318,517 B2 * | 1/2008 | Roder et al. | ................ | 198/619 |

FOREIGN PATENT DOCUMENTS

| | | |
|---|---|---|
| JP | 03-103086 A | 4/1991 |
| JP | 05-23661 A | 9/1993 |
| JP | 2522480 B2 | 8/1996 |
| JP | 2905508 B2 | 6/1999 |
| JP | 2003-209963 A | 7/2003 |

* cited by examiner

# NON-CONTACT CONVEYING DEVICE USING SUPERCONDUCTING MAGNETIC LEVITATION

TECHNICAL FIELD

The present invention relates to a device for non-contact (or isolated) transfer of, e.g., semiconductor chips or precision components in an airtight room (including a particular-gas atmosphere chamber and a vacuum chamber) or in an isolated room having temperatures different from external air, samples in a sterile room, or other objects including components, finished products, liquid or solid matter, animals, and plants.

BACKGROUND ART

Currently, semiconductors must be produced in a clean vacuum chamber where even presence of micron-sized dust is not permissible. A clean room robot which does not generate dust needs to be employed to transfer silicon wafers in the vacuum chamber, and it is desirable that the wafers are isolated from a semiconductor-manufacturing device during transfer and all processing steps are completed in the hermetically sealed vacuum chamber.

To transfer objects inside such a vacuum or airtight chamber by handling the objects from the exterior of the chamber, for example, a conveying device using superconducting magnetic levitation is favorably employed. For example, Published Japanese Patent Application No. 63-310304 discloses such a magnetic levitation device using superconductivity.

Published Japanese Patent Application No. 63-310304 discloses a technology in which superconductors and a magnet array comprising arranged magnets are repelled each other in order to levitate either one of them. In this instance, one of the magnet array and superconductors, usually the superconductors, are transferred to convey the magnet array (object to be conveyed). In the technology disclosed in the publication, however, when disturbance such as impact occurs on the superconductors, the levitated magnet array vibrates. This causes a problem that the vibration of the magnet array continues permanently because the array is suspended in free space due to pinning effect.

DISCLOSURE OF INVENTION

The present invention has been made in view of the problem of the conventional art, and thus it is an object of the present invention to provide a non-contact conveying device using superconducting magnet levitation, capable of damping the vibration of an object to be conveyed (conveying table in particular) in a short period of time even if disturbance occurs to superconductors or to the object contactlessly conveyed by superconducting magnet levitation, thereby stably conveying the object.

To accomplish the object, the present invention provides a non-contact conveying device using superconducting magnetic levitation, the device comprising: a conveying table for carrying an object to be conveyed, the conveying table having a plurality of permanent magnets at a bottom thereof; a conveying guide unit having superconductors respectively disposed immediately below the permanent magnets of the conveying table; a distance sensor provided in the conveying guide unit for detecting a distance between the conveying table and the conveying guide unit; a damping coil provided in the conveying guide unit for generating a magnetic field upon energization thereof, thereby suppressing vibration of the conveying table; and a control device for detecting displacement of the conveying table by a signal from the distance sensor and regulating electric current applied to the damping coil.

In the device of the present invention, transfer of the conveying guide unit results in transfer of the conveying table spaced apart from the conveying guide unit. If vibration occurs on the conveying guide unit or directly on the conveying table, displacement thereof is detected by the distance sensor and electric current is applied to the damping coil. As a result, the vibration can be suppressed in a short period of time.

In the device of the present invention, the conveying table may be placed inside an airtight container (e.g., a vacuum container), and the conveying guide unit may be placed outside the airtight container. In this manner, transfer of the conveying guide unit results in movement of the conveying table and the object to be conveyed (such as silicon) placed thereon within the airtight container.

In the device of the present invention, each of the superconductors may have a ring shape divided into plural parts, and the damping coil may be positioned substantially concentrically at a bottom of the each of the ring-shaped superconductors. This permits magnetic fluxes from the damping coils to pass through inner holes of the ring-shaped superconductors effectively. Furthermore, the magnetic fluxes are concentrated or reinforced by the superconductors surrounding the fluxes. Thus, magnetic action of the damping coils on the permanent magnets attached to the conveying table is not reduced even if the damping coils are placed under the superconductors. As a result, the damping coils can be disposed under the superconductors, thereby reducing the distance from the superconductors to the conveying table.

In the device of the present invention, the conveying table may have a magnetic material at the center thereof, and the damping coil may be arranged immediately below the magnetic material. This configuration requires only one damping coil, thereby simplifying the device itself. In this case, the magnetic material may be a second permanent magnet and the damping coil may be an air-cored coil. Thereby, damping effects with greater power can be obtained more efficiently in a short period of time.

In the device of the present invention, the distance sensor may comprise a Hall element disposed at a top of the conveying guide unit. The sensor detects magnetism of the permanent magnets provided under the conveying table, thereby measuring the distance between the conveying table and the conveying guide unit. In this instance, if the Hall element is influenced by magnetism generated by the damping coil, the output of the distance sensor is obtained by subtracting the output of the magnetic field generated by the damping coil from the final output of the Hall element. The Hall element may be disposed over each of the superconductors.

In the device of the present invention, it is preferable that the permanent magnets provided to the conveying table are arranged in a Halbach array so that magnetic poles of the permanent magnets are directed only downward of the conveying table. Accordingly, magnetic fluxes of the permanent magnets can be utilized more effectively. Furthermore, the magnetic fluxes do not leak toward the conveying table, which means that the object to be conveyed is not affected by the magnetic field.

In the device of the present invention, it is preferable that the control device substantially comprises a circuit for performing differential (derivative) control of a distance between the conveying table and the conveying guide unit detected by the distance sensor. When the conveying table having the permanent magnets is located over the superconductors, the permanent magnets float over the superconductors due to the pinning effect. When the superconductors move up or down, the magnetic fluxes therefrom generate magnetism in directions opposite to the moving directions thereof. Namely, the superconductors themselves perform what is called proportional control. On the other hand, when vibration occurs on the conveying table, the vibration can be suppressed by force between the superconductors and the permanent magnets. Accordingly, a value obtained by differentiating the position (displacement) of the conveying table is employed as a control element, and electric current in a prescribed amount is applied to the damping coils in a direction to damp vibration of the conveying table. Thereby, the vibration of the conveying table can be rapidly stopped.

In the device of the present invention, the superconductors may be cooled by a refrigerant (for example, liquid nitrogen, liquid helium, liquid argon, liquid hydrogen, etc.), but preferably cooled by a freezer. As a result, the device can be used continuously.

BRIEF DESCRIPTION OF DRAWINGS

FIG. 3 (A) and FIG. 3 (B) are descriptive illustrations of a superconductor of the non-contact conveying device.

FIG. 5 (A) and FIG. 5 (B) are descriptive illustrations of a superconductor of the non-contact conveying device according to the second embodiment.

BEST MODE FOR CARRYING OUT THE INVENTION

Referring now to the accompanying drawings, embodiments of the present invention are described for a more complete understanding of the invention.

Figure 1:
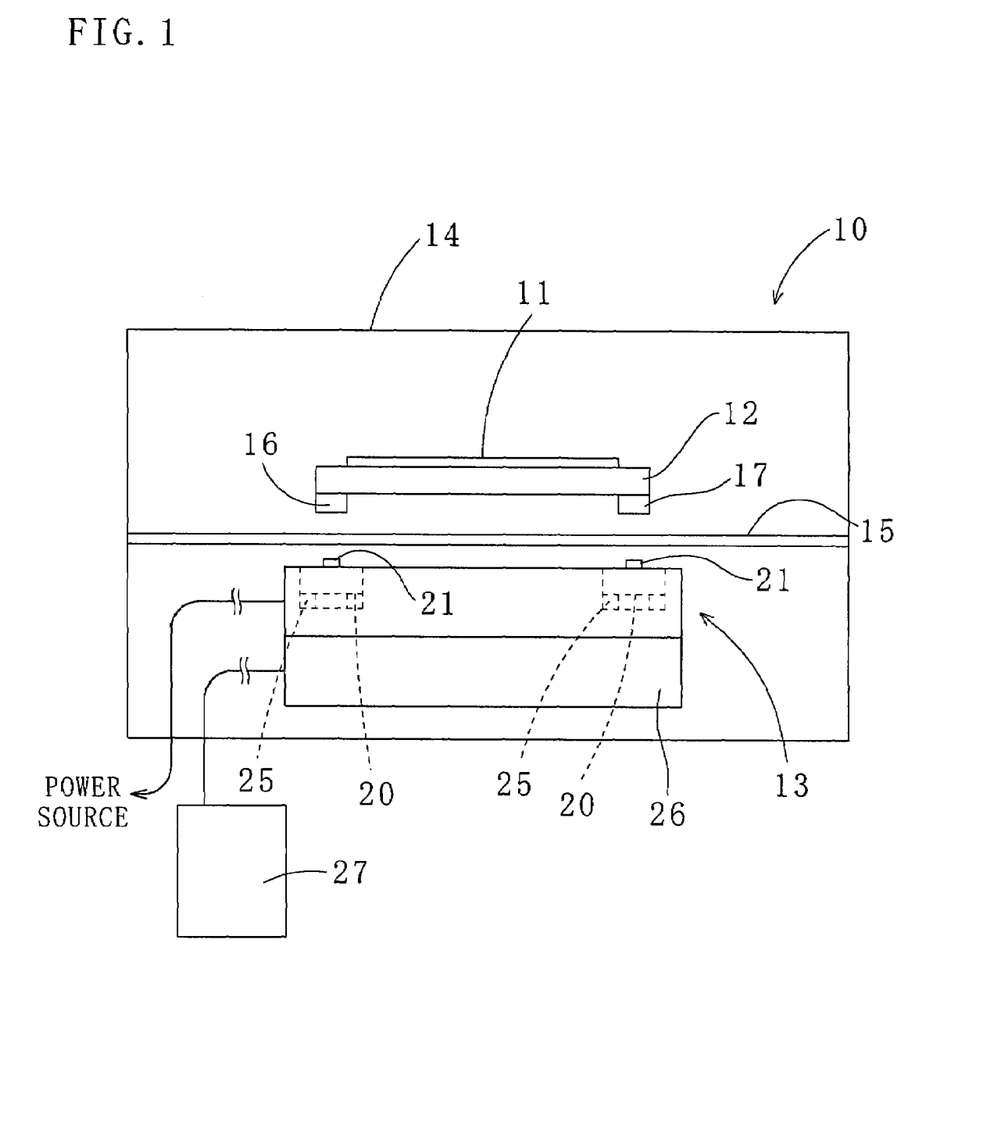
FIG. 1 is a descriptive illustration of a non-contact conveying device using superconducting magnetic levitation according to a first embodiment of the present invention.

As illustrated in FIG. 1, a non-contact (contactless) conveying device 10 using superconducting magnetic levitation according to a first embodiment of the present invention includes a conveying table 12 for conveying a silicon wafer 11 which is an example of an object to be conveyed, and a conveying guide unit 13 for guiding the conveying table 12. The conveying table 12 is housed in a vacuum container (or a vacuum chamber) 14 which is an example of an airtight container. The conveying guide unit 13 is provided outside the vacuum container 14 and immediately below the conveying table 12. A bottom plate 15 of the vacuum container 14 is made of non-magnetic material, e.g., austenitic stainless steel.

Figure 2:
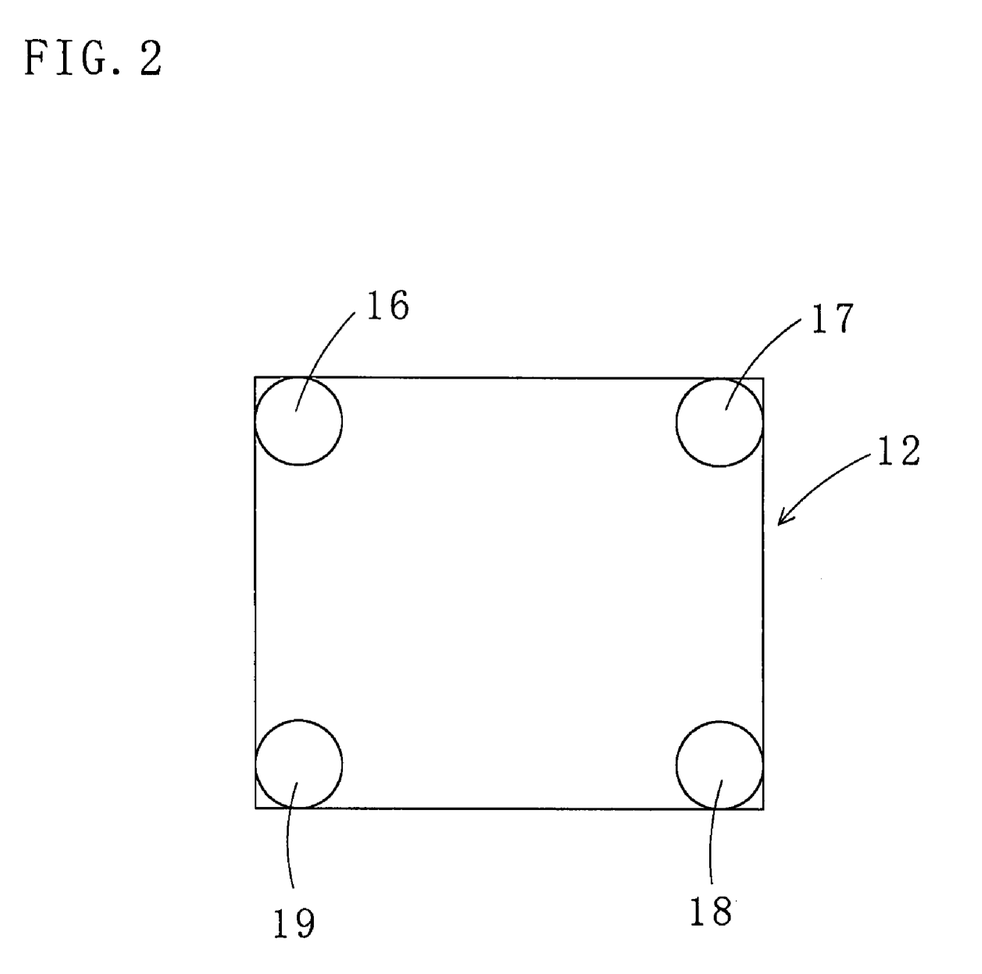
FIG. 2 is an undersurface of a conveying table of the non-contact conveying device.

The upside and downside of the conveying table 12 are made of non-magnetic material and magnetic material, respectively. As illustrated in FIG. 2, the conveying table 12 has permanent magnets 16-19 respectively provided at the four corners of the bottom thereof. The permanent magnets 16-19 are disposed in a manner that adjacent magnetic poles are opposite. In the present embodiment, the conveying table 12 is provided to transport the silicon wafer 11. Alternatively, the conveying table 12 may convey bacteria or special animals and plants when the airtight container is an airtight chamber retained under special conditions and certain temperature conditions. In the present embodiment, the four permanent magnets 16-19 are provided. Alternatively, a different number of (e.g., 3 or 5 or more) permanent magnets may be employed in some cases.

Figure 3A:
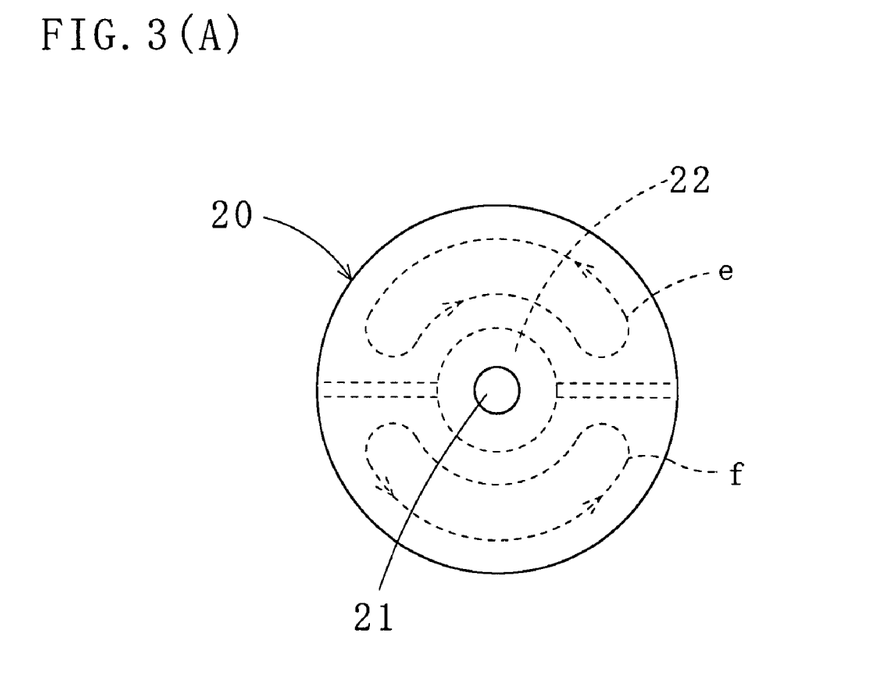
Figure 3B:
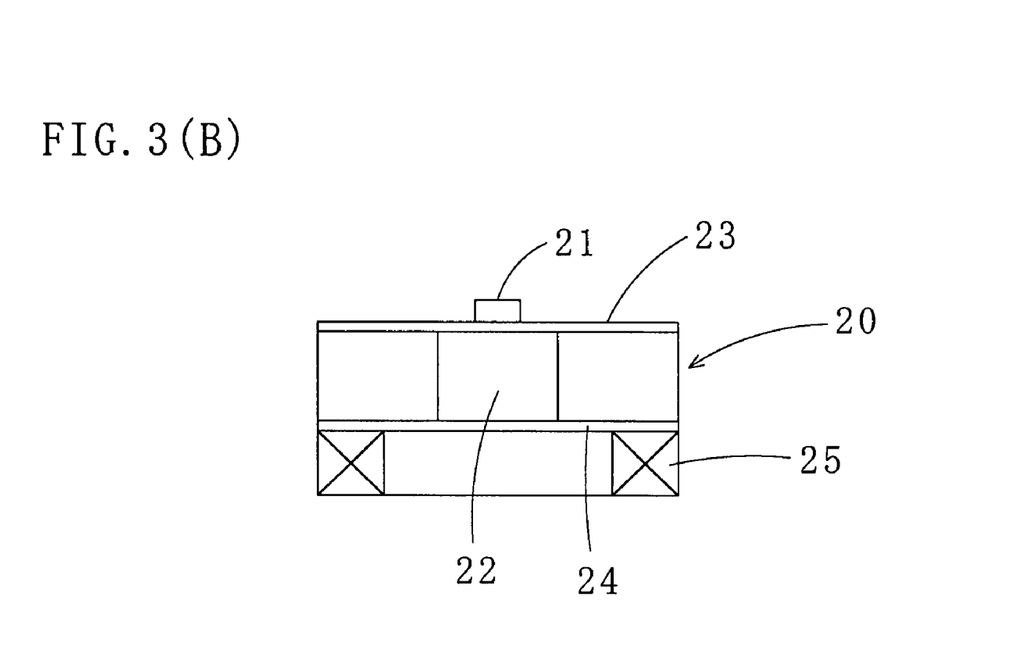

The conveying guide unit 13 includes a frame made of nonmagnetic material not shown, in which four superconductors 20 are provided immediately below the respective permanent magnets 16-19. A Hall element 21, an example of a distance sensor, is disposed over each of the superconductors 20. As illustrated in FIG. 3 (A), each of the superconductors 20 is a ring-shaped conductor that is insulatingly divided into two parts in the center. An inner hole 22 is formed in the center of the each of the superconductors 20. As illustrated in FIG. 3 (B), non-magnetic insulating plates 23, 24 are respectively provided at the top and bottom of the each of the superconductors 20. The Hall element 21 is disposed on the plate 23. A damping coil 25 is positioned concentrically at the bottom of each of the superconductors 20.

The exterior of each of the superconductors 20 is covered with a thermal insulator not shown, and is cooled to the critical temperature or below (e.g., 3K below the critical temperature) by a cryocooler 26 attached to the conveying guide unit 13.

The conveying guide unit 13 is equipped with a vertical transfer mechanism and a horizontal transfer mechanism (XY transfer mechanism) not shown, both of which have known structures. The mechanisms allow the conveying guide unit 13 to rise, lower or move horizontally in a prescribed direction when necessary.

The Hall elements 21 arranged over the respective superconductors 20 detect magnetic flux densities of the permanent magnets 16-19 provided immediately above the Hall elements 21, and output the analog values to a control device 27. The control device 27 converts the analog signals from the Hall elements 21 to digital signals, and enters the digital signals into an internal control unit (e.g., a computer). The internal control unit calculates distances from the superconductors 20 to the permanent magnets 16-19 respectively disposed over the superconductors 20 using the signals from the Hall elements 21. When necessary, electric current is applied to the damping coils 25 to provide the permanent magnets 16-19 with repulsion or attraction, thereby suppressing vibration of the permanent magnets 16-19.

In this case, application of electric current to the damping coils 25 generates magnetic fields penetrating the inner holes 22, thereby influencing output of the Hall elements 21. Therefore, the control unit cancels the value equal to magnetic flux density generated by one of the damping coils 25 from the value measured by corresponding one of the Hall elements 21. In this manner, the values measured by the Hall elements 21 are corrected to appropriate values.

Distances "L" between the superconductors 20 and permanent magnets 16-19 disposed thereabove, which are measured by the Hall elements 21, are continuously entered to the control unit. The control unit amplifies the time derivative values of the distances "L" (i.e., by a proportional constant "k") and applies the values to the damping coils 25, thereby regulating fluctuations of the distances "L." Accordingly, when the conveying table 12 moves up or down by impact, force opposite to the movement of the conveying table 12 is applied by the superconductors 20, causing the conveying table 12 to vibrate vertically. This vertical vibration of the conveying table 12 is damped by the electric current applied to the damping coils 25.

In the embodiment, each of the superconductors 20 is divided into two parts. As illustrated in FIG. 3 (A), electric current flows in directions of arrows "e" and "f" or in the opposite directions thereof. Thus, the magnetic fluxes from the damping coils 25 can pass through the inner holes 22. Furthermore, the magnetic fluxes are converged by the superconductors 20, and thereby affecting the permanent magnets 16-19 without attenuating.

Operation of the non-contact conveying device 10 using superconducting magnetic levitation is now described to complete the explanation thereof.

In a state that the prescribed object to be conveyed (silicon wafer 11) is placed on the conveying table 12, the conveying guide unit 13 is disposed immediately below the conveying table 12 so that the superconductors 20 are located immediately below the respective permanent magnets 16-19. The superconductors 20 are normal conductors in this state because they are not cooled. Then, the conveying guide unit 13 is elevated to maintain a certain distance between the unit 13 and the conveying table 12. The certain distance is a distance at which the conveying table 12 can be lifted by the four superconductors 20. Then, the superconductors 20 are cooled by the cryocooler 26 to a temperature where each of the superconductors 20 exhibits superconductivity. Elevation of the conveying guide unit 13 by a certain height in this state allows the conveying table 12 to levitate within the vacuum container 14, and lateral movement of the conveying guide unit 13 causes lateral movement of the conveying table 12. As a result, the object placed on the conveying table 12 can be transferred.

When impact in the vertical direction is applied to the conveying table 12 or conveying guide unit 13, the conveying table 12 begins to vibrate vertically. The Hall elements 21 detect the displacement of the vibration, and electric current in proportion to the differential components of the displacement is applied to the damping coils 25. The time constants of the damping coils 25 are sufficiently small. Damping force "F" generated by the damping coils 25 is preferably 0.1 to 1.0 times a value "B" which is the product of "α" and "m", where "α" is vibration speed or vibration acceleration of the conveying table 12 and "m" is total weight of the conveying table 12 and the object to be conveyed. A decrease in the value "B" causes a decrease in the damping force "F," which results in insufficient damping force. Consequently, it takes time to damp the conveying table 12. An increase in the value "B" requires large electric current, and excessive damping force is applied. By determining the damping force "F" in the above range, vibration of the conveying table 12 can be stopped in a relatively short period of time.

Figure 4:
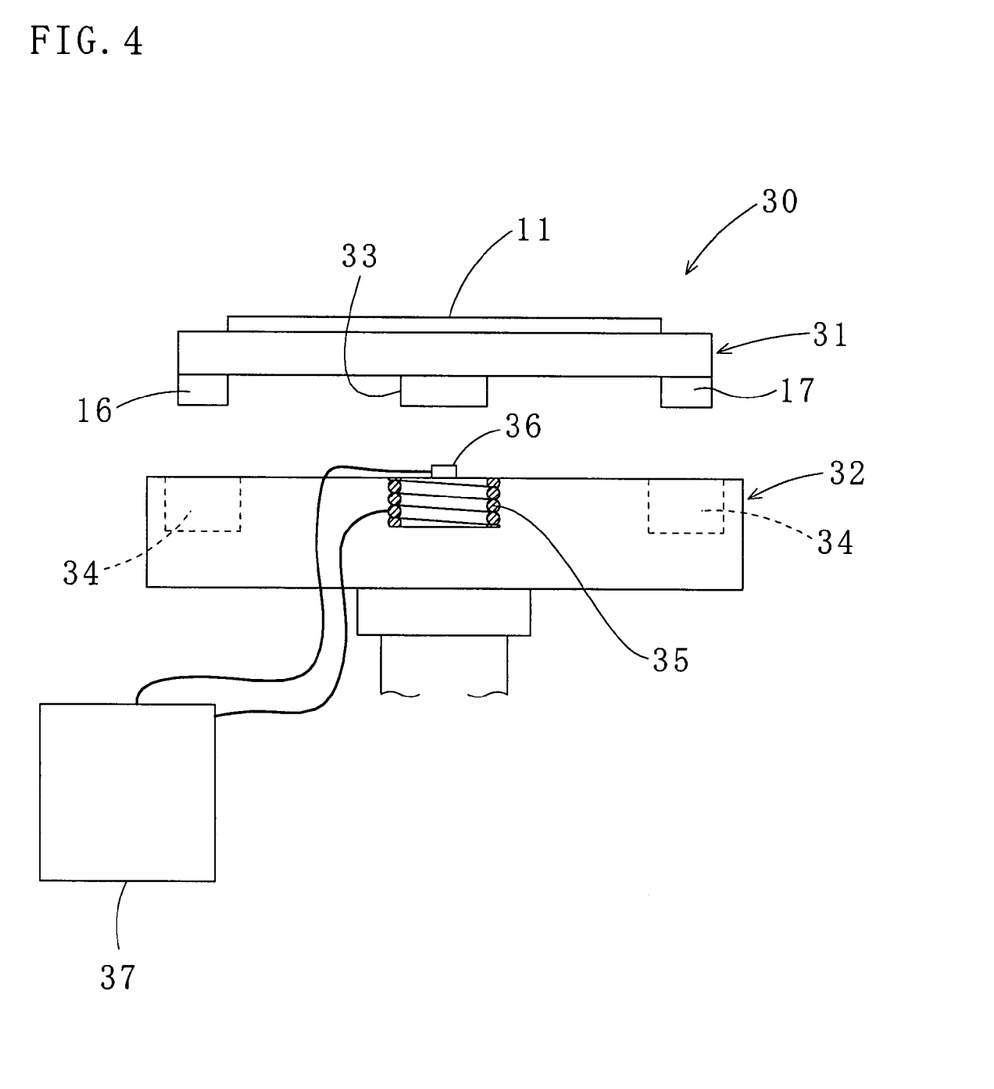
FIG. 4 is a descriptive illustration of a non-contact conveying device using superconducting magnetic levitation according to a second embodiment of the present invention.
Figure 5A:
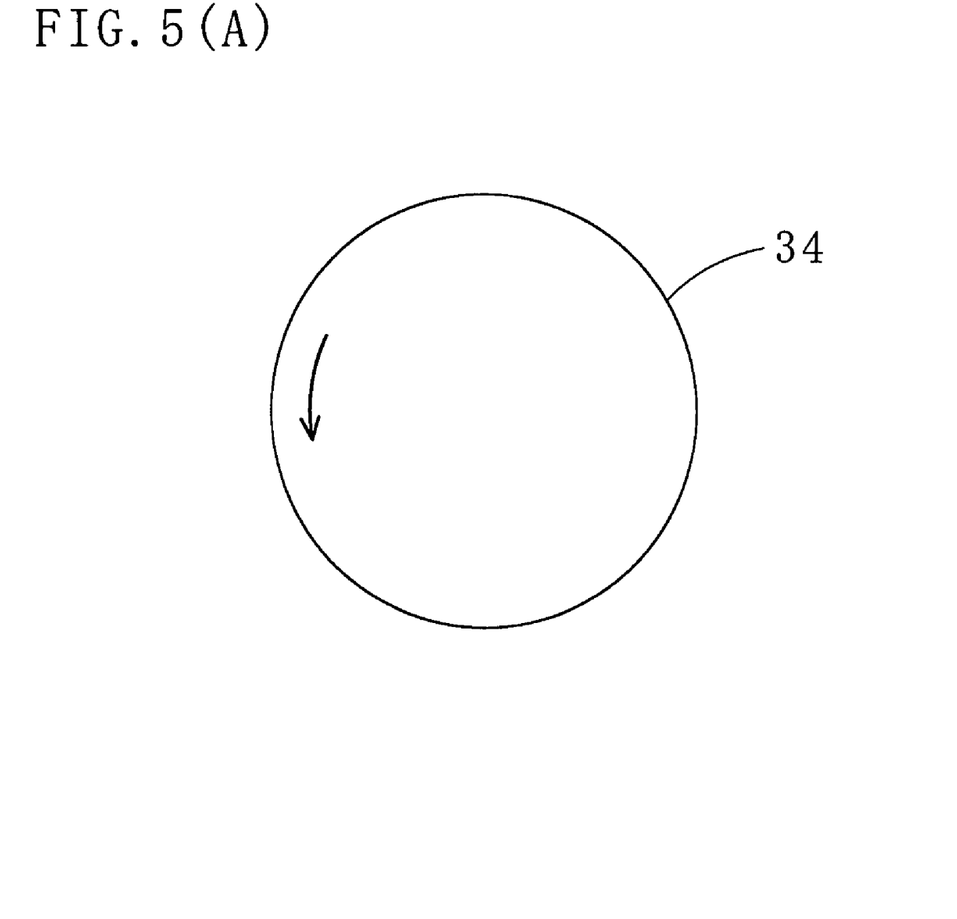
Figure 5B:
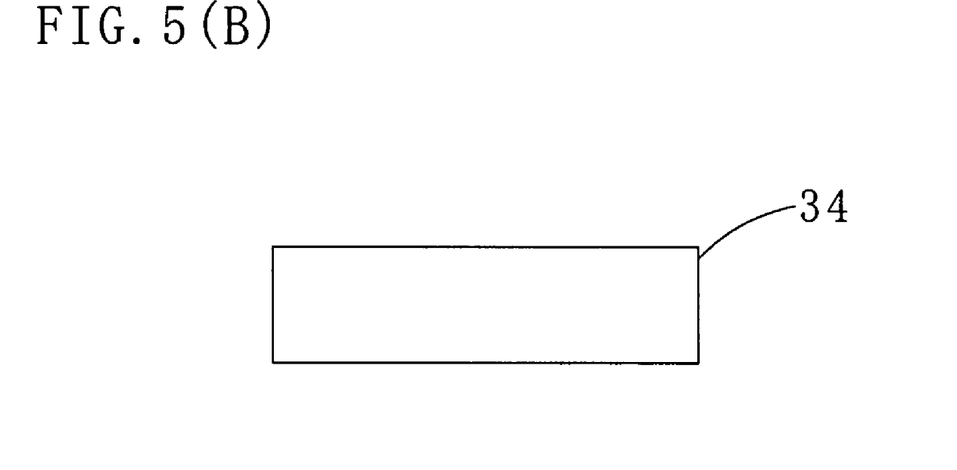

Referring now to FIGS. 4 and 5, a non-contact conveying device 30 using superconducting magnetic levitation according to a second embodiment of the present invention is described. The same components as those of the contact-free conveying device 10 according to the first embodiment are provided with the same numerals, and a detailed description thereof is omitted.

As shown in FIG. 4, the non-contact conveying device 30 by superconducting magnetic levitation according to the second embodiment of the present invention includes a conveying table 31 and a conveying guide unit 32. The conveying table 31 has the permanent magnets 16-19 on the periphery of the bottom thereof as the conveying table 12 does, and also has a second permanent magnet 33, an example of magnetic material, at the center of the bottom thereof. The conveying guide unit 32 has superconductors 34 respectively positioned to correspond to the locations of the permanent magnets 16-19, and a damping coil 35 made of an air-cored coil positioned to correspond to the location of the second permanent magnet 33.

Alternatively, the permanent magnets 16-19, 33 and supplementary permanent magnets can be arranged in a Halbach array. This either eliminates or remarkably reduces magnetic flux at the upper side of the conveying table 31.

As illustrated in FIGS. 5 (A) and 5 (B), each of the permanent magnets 34 is made of a circular plate. The exteriors of the permanent magnets 34 are cooled by the cryocooler when necessary so that the permanent magnets 34 exhibit superconductivity. A Hall element 36, an example of a distance sensor, is disposed in the uppercenter of the conveying guide unit 32. The Hall element 36 detects magnetism of the second permanent magnet 33 provided to the conveying table 31. According to the strength of the magnetism, the element 36 detects distance between the conveying table 31 and the conveying guide unit 32. Magnetism generated from the damping coil 35 is determined by electric current applied thereto. Thus, the control device 37 subtracts the value corresponding to the magnetism generated by the damping coil 35 from the output of the Hall element 36, whereby the distance between the conveying table 31 and the conveying guide unit 32 is measured.

As in the first embodiment, the control device 37 in the second embodiment includes a control unit programmed with a prescribed program, the conveying table 31 is levitated over the conveying guide unit 32 usually by pinning effect, and the conveying guide unit 32 is moved to transfer the conveying table 31. In this embodiment, only one Hall element 36 is provided to the conveying guide unit 32, which advantageously simplifies the entire circuit.

If vibration of the conveying table 31 occurs due to load change (e.g., placement of the object on the conveying table 31 or removal thereof) or abnormal operation of the conveying guide unit 32 or of the conveying table 31, a distance signal between the conveying table 31 and the conveying guide unit 32, which has been detected by the Hall element 36, is differentiated and the differentiated signal is amplified and fed to the damping coil 35. This drastically reduces vibration of the conveying table 31 and damps the vibration.

EXAMPLES

Figure 6:
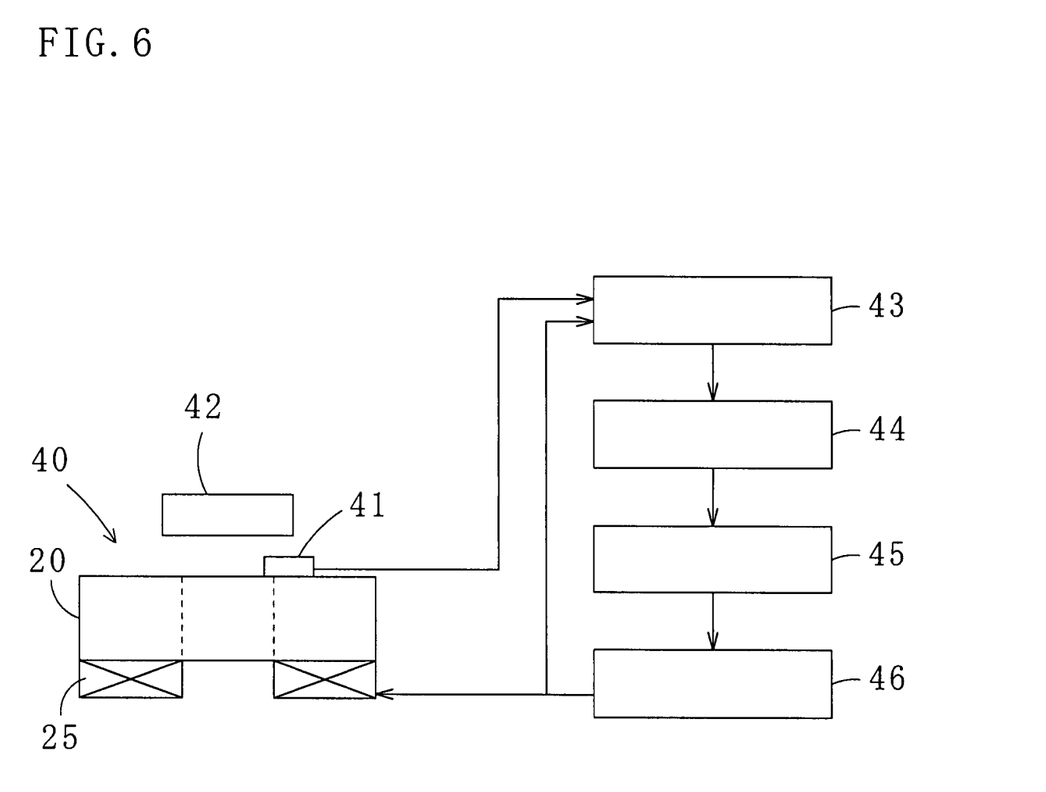
FIG. 6 is a schematic block diagram of a device employed in experiments.
Figure 7:
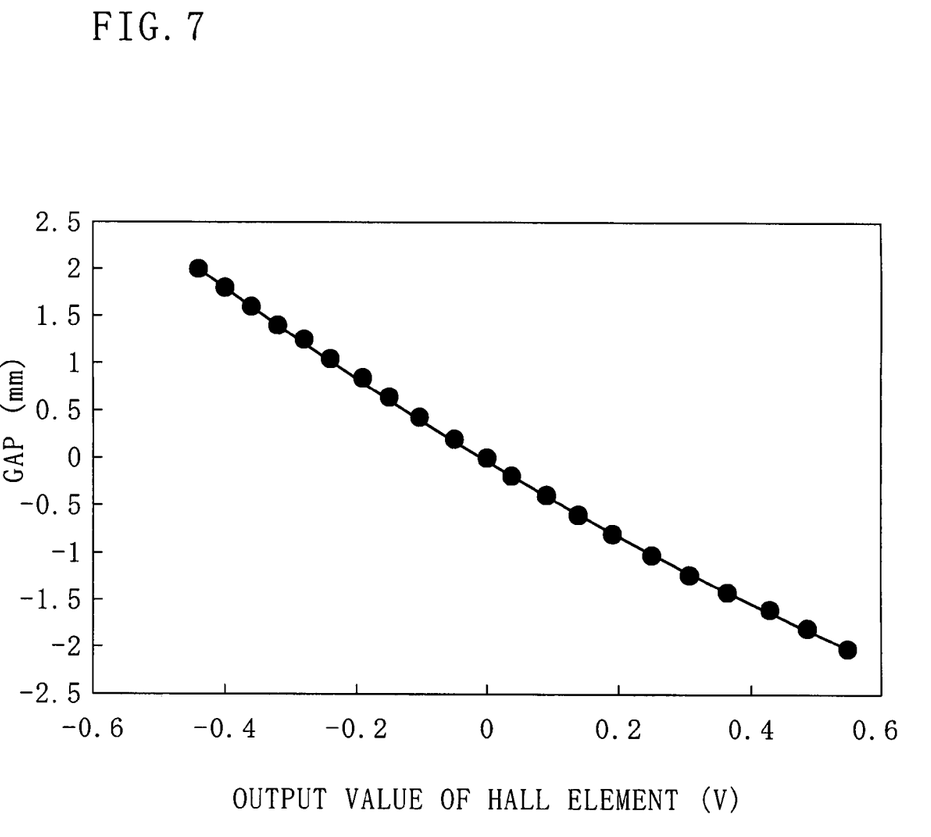
FIG. 7 is a graph illustrating the relationship between an output value of a Hall element and a gap.

The following discusses experiments that were performed to verify functions and effects of the present invention. As illustrated in FIG. 6, a device 40 used in the experiments employs the dual partitioned superconductor 20 shown in FIG. 3. The damping coil 25 is disposed at the bottom of the superconductor 20. A Hall element 41, an example of a distance sensor, is placed on the superconductor 20 to detect vertical displacement of a disk-shaped permanent magnet 42 (i.e., a gap between the permanent magnet 42 and the superconductor 20). The permanent magnet 42 configures a simulated conveying table. FIG. 7 illustrates the relationship between an output value of the Hall element 41 and the gap. FIG. 7 shows that the output of the Hall element 41 was proportional to the gap when the permanent magnet 42 was placed in a prescribed position and the gap was varied.

Signals from the Hall element 41 are fed back to the damping coil 25 via an AD converter 43, a differentiating circuit 44, a DA converter 45, and an amplifier circuit 46. When displacement detected by the Hall element 41 decreases, namely, when the permanent magnet 42 moves downward, electric current is applied to the damping coil 25 to elevate the permanent magnet 42. The amplifier circuit 46 is provided with a volume controller (a variable resistor) for varying amplification of the amplifier circuit 46, thereby amplifying analog signals converted from digital signals to a given level. In actual operation, the amplifier circuit 46 is previously adjusted so that vibration of the permanent magnet 42 can be minimized. Specifically, current negative speed or negative acceleration "Q" (Q=0.1P-P) that corresponds to speed or acceleration "P" generated by the permanent magnet 42 is generated at the damping coil 25.

Figure 8:
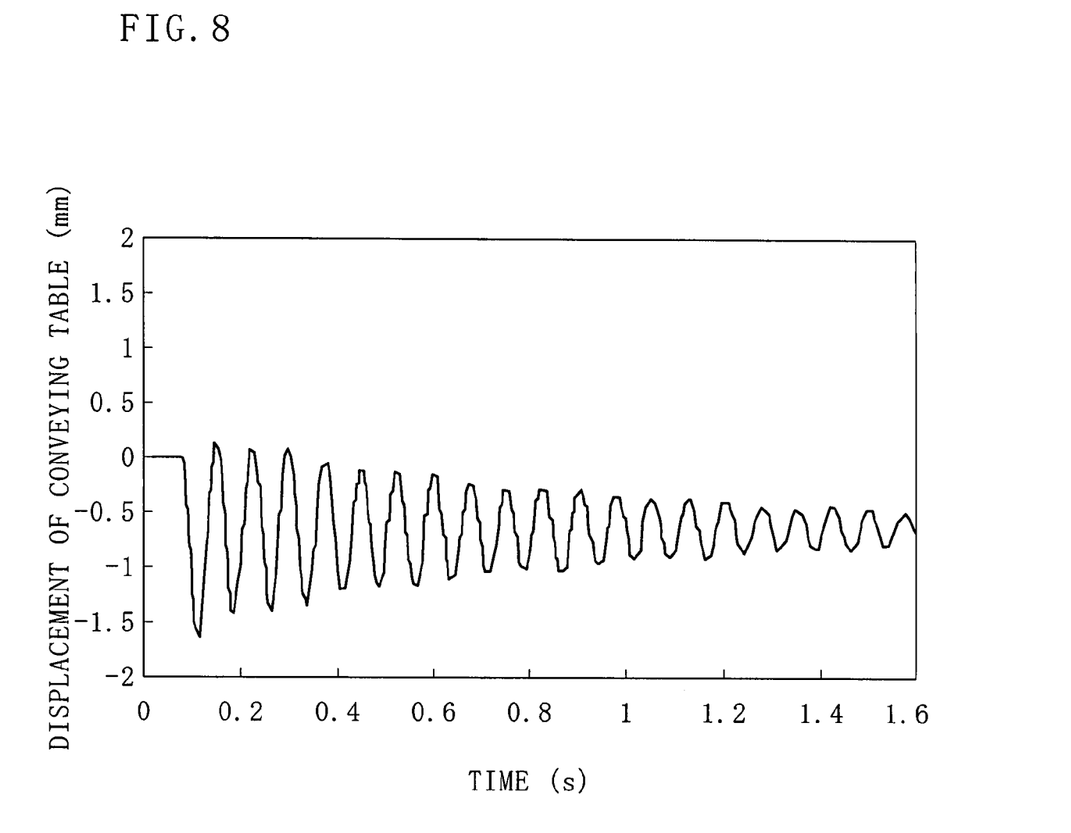
FIG. 8 is a graph illustrating the relationship between displacement of the conveying table and time when a damping coil is not activated.
Figure 9:
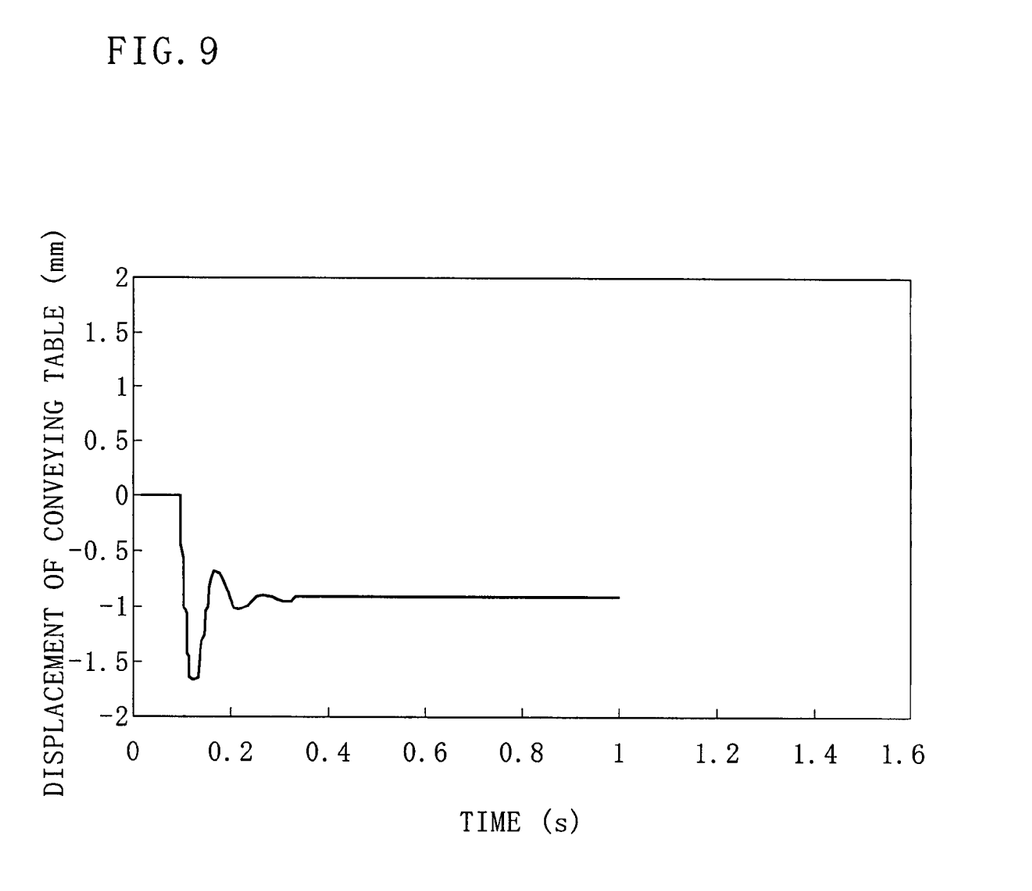
FIG. 9 is a graph illustrating the relationship between displacement of the conveying table and time when the damping coil is activated.

FIG. 8 illustrates the relationship between displacement of the permanent magnet 42 and time when an object to be conveyed having a certain weight was placed on the permanent magnet 42 in a state that electric current was not applied to the damping coil 25. FIG. 8 shows that the permanent magnet 42 vibrated up and down over a considerably long period of time. FIG. 9 illustrates displacement of the permanent magnet 42 when signals obtained by differentiating signals detected by the Hall element 41 were applied to the damping coil 25. FIG. 9 shows that vibration of the permanent magnet 42 came to an end in a short period of time.

The above experiments demonstrate that control (differential control) to feed back the signals obtained by differentiating the signals measured by the distance sensor to the damping coil is effective for contact-free conveyance by superconducting magnetic levitation.

In the embodiments and experiments, the Hall elements are used as the distance sensors. Alternatively, eddy-current sensors, ultrasonic sensors, capacitance sensors, or optical sensors may be employed.

In the embodiments, the plate-shaped conveying table is used. Alternatively, for example, a container-like conveying table may be employed according to the purpose. In the embodiments, the superconductors and the damping coils are separately disposed in the conveying guide units. Alternatively, the superconductors and damping coils may be combined. Namely, the damping coils may be made of superconductors, thereby further downsizing the device itself.

Furthermore, the superconductors are cooled down by the cryocooler in the embodiments. Alternatively, a refrigerant having a temperature not higher than a prescribed temperature may be employed.

INDUSTRIAL APPLICABILITY

The non-contact conveying device using superconducting magnetic levitation according to the present invention is operable to convey objects without contacting the objects. For example, objects or substances within a chamber having an atmosphere and/or temperature conditions different from external air can be transferred by remote handling. Therefore, the non-contact conveying device of the present invention can be utilized effectively especially for transfer or conveyance of semiconductor elements or components thereof within the chamber, or for conveyance of samples or bacteria in a sterile room.

Because the object to be conveyed on the conveying table is levitated, the object is less vulnerable to external vibration during conveyance. Even if the external vibration occurs during conveyance, the object is conveyed with reducing vibration transmitted to the object.

Furthermore, control of electric current applied to the damping coils allows the object on the conveying table to be moved vertically. The combination of the vertical movement with horizontal movement of the conveying table permits the object to be transferred in three-dimensional space.

In particular, when the conveying table attached to the end of a robot hand is moved back and forth, and side to side, the object to be conveyed can be remotely operated while being at a distance from the conveying table. Thus, for example, when the object has a high potential, the object can be transferred while being insulated from the grounded conveying table.

The invention claimed is:

1. A non-contact conveying device using superconducting magnetic levitation, comprising:
    a conveying table for carrying an object to be conveyed, the conveying table having a plurality of permanent magnets at a bottom thereof;
    a conveying guide unit having superconductors respectively disposed immediately below the permanent magnets of the conveying table;
    a distance sensor provided in the conveying guide unit for detecting a distance between the conveying table and the conveying guide unit;
    a damping coil provided in the conveying guide unit for generating a magnetic field upon energization thereof, thereby suppressing vibration of the conveying table; and
    a control device for detecting displacement of the conveying table by a signal from the distance sensor and regulating electric current applied to the damping coil.

2. The non-contact conveying device using superconducting magnetic levitation according to claim 1, wherein the conveying table is placed inside an airtight container, and the conveying guide unit is placed outside the airtight container.

3. The non-contact conveying device using superconducting magnetic levitation according to claim 1, wherein each of the superconductors has a ring shape divided into plural parts, and the damping coil is positioned substantially concentrically at a bottom of the each of the ring-shaped superconductors.

4. The non-contact conveying device using superconducting magnetic levitation according to claim 1, wherein the conveying table has a magnetic material at the center thereof, and the damping coil is arranged immediately below the magnetic material.

5. The non-contact conveying device using superconducting magnetic levitation according to claim 4, wherein the magnetic material is a second permanent magnet and the damping coil is an air-cored coil.

6. The non-contact conveying device using superconducting magnetic levitation according to claim 1, wherein the distance sensor comprises a Hall element disposed at a top of the conveying guide unit.

7. The non-contact conveying device using superconducting magnetic levitation according to claim 6, wherein the Hall element is disposed over each of the superconductors.

8. The non-contact conveying device using superconducting magnetic levitation according to claim 1, wherein the permanent magnets provided to the conveying table are arranged in a Halbach array so that magnetic poles of the permanent magnets are directed only downward of the conveying table.

9. The non-contact conveying device using superconducting magnetic levitation according to claim 1, wherein the control device substantially comprises a circuit for performing differential control of a distance between the conveying table and the conveying guide unit detected by the distance sensor.

10. The non-contact conveying device using superconducting magnetic levitation according to claim 1, wherein the superconductors are cooled by a refrigerant or a cryocooler.

* * * * *